United States Patent
Uchida et al.

(10) Patent No.: US 10,398,020 B2
(45) Date of Patent: Aug. 27, 2019

(54) CIRCUIT ASSEMBLY AND MANUFACTURING METHOD OF CIRCUIT ASSEMBLY

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Koki Uchida, Yokkaichi (JP); Yukinori Kita, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/165,288

(22) Filed: Oct. 19, 2018

(65) Prior Publication Data
US 2019/0124756 A1    Apr. 25, 2019

(30) Foreign Application Priority Data
Oct. 24, 2017 (JP) ................. 2017-204959

(51) Int. Cl.
*H05K 1/02* (2006.01)
*H05K 1/18* (2006.01)
*H05K 3/30* (2006.01)

(52) U.S. Cl.
CPC ........... *H05K 1/0204* (2013.01); *H05K 1/181* (2013.01); *H05K 3/305* (2013.01); *H05K 2201/066* (2013.01); *H05K 2201/10409* (2013.01)

(58) Field of Classification Search
CPC .............................................. H05K 2201/066
See application file for complete search history.

(56) References Cited

U.S. PATENT DOCUMENTS

| | | | |
|---|---|---|---|
| 6,222,732 B1 * | 4/2001 | Jakob ................. | H05K 1/0209 174/252 |
| 2004/0048414 A1 * | 3/2004 | Heinz ................. | H05K 1/0206 438/106 |
| 2005/0092478 A1 * | 5/2005 | Jairazbhoy ........... | F28F 13/003 165/185 |

(Continued)

FOREIGN PATENT DOCUMENTS

JP    2015-156463 A    8/2015

*Primary Examiner* — Hung V Ngo
(74) *Attorney, Agent, or Firm* — Oliff PLC (57) ABSTRACT

A circuit assembly that includes a heat generator; a circuit board, which has a conduction path, and to which the heat generator is mounted, a heat dissipating member arranged facing the circuit board, an insulating film arranged in a region that is overlapped by the heat generator between the circuit board and the heat dissipating member, an adhesive or sticky first heat conductor that is arranged between the circuit board and the insulating film and is in contact with the circuit board and the insulating film, and an adhesive or sticky second heat conductor that is arranged between the insulating film and the heat dissipating member and is in contact with the insulating film and the heat dissipating member.

6 Claims, 6 Drawing Sheets

(56) References Cited

U.S. PATENT DOCUMENTS

| | | | | |
|---|---|---|---|---|
| 2006/0012034 A1* | 1/2006 | Kadoya | ............... | H05K 1/0203 |
| | | | | 257/712 |
| 2006/0018098 A1* | 1/2006 | Hill | ................... | H05K 1/0204 |
| | | | | 361/708 |
| 2015/0200337 A1* | 7/2015 | Denda | ................. | H05K 1/115 |
| | | | | 257/99 |
| 2016/0106010 A1* | 4/2016 | Ito | ................... | H05K 7/20854 |
| | | | | 361/707 |
| 2017/0256929 A1* | 9/2017 | Kobayashi | ............. | B60R 16/02 |
| 2017/0290139 A1* | 10/2017 | Ooi | ................... | H05K 1/0203 |
| 2017/0353020 A1* | 12/2017 | Yamashita | ......... | H05K 7/20445 |

* cited by examiner

CIRCUIT ASSEMBLY AND MANUFACTURING METHOD OF CIRCUIT ASSEMBLY

This application claims priority from JP 2017-204959 filed Oct. 24, 2017, the entire disclosure of which is incorporated herein by reference.

BACKGROUND

The present specification discloses technology relating to a circuit assembly

Overlapping a circuit board and a heat dissipating member via an insulating layer is a well known technology. In this wiring board in of JP 2015-156463A, forms wiring for electrical connections and wiring for heat dissipation are formed via an adhesive layer on one side of a polyimide layer, with a heat dissipating plate layered onto the other side of the polyimide layer via an adhesive layer. Through-wiring that is connected to the wiring for heat dissipation is formed in through-holes that are formed in the polyimide layer and one of the adhesive layers. The wiring for electrical connections and the wiring for heat dissipation are selectively covered by an insulating layer in a selectively exposed state. As a result, there is electrical insulation and thermal conductivity between the electrical connection wiring and the heat dissipating plate due to the adhesive layer and the polyimide layer.

SUMMARY

In the configuration in JP 2015-156463A, there is the problem that it is not easy perform such tasks work (rework) as peeling the adhesive layer from a component to replace the component, because all regions of the wiring for electrical connections and the wiring for heat dissipation, as well as all regions of the heat dissipating plate are adhered to the adhesion layer.

An exemplary aspect of the disclosure provides a circuit assembly which makes reworking easier while maintaining the electrical insulation and heat dissipation between a circuit board and a heat dissipating member.

A circuit assembly disclosed in the present description includes a heat generator; a circuit board, which has a conduction path, and to which the heat generator is mounted, a heat dissipating member arranged facing the circuit board, an insulating film arranged in a region that is overlapped by the heat generator between the circuit board and the heat dissipating member, an adhesive or sticky first heat conductor that is arranged between the circuit board and the insulating film and is in contact with the circuit board and the insulating film, and an adhesive or sticky second heat conductor that is arranged between the insulating film and the heat dissipating member and is in contact with the insulating film and the heat dissipating member, wherein: the circuit board and the heat dissipating member are fixed together, and an air layer is formed between the circuit board and the heat dissipating member in a region in which the insulating film is not arranged.

A manufacturing method of a circuit assembly disclosed in the present description includes applying an adhesive or sticky first heat conductor to a region which is overlapped by a heat generator, in a circuit board that has a conduction path, applying an adhesive or sticky second heat conductor to a heat dissipating member that is arranged facing the circuit board, bonding the insulating film to the first heat conductor or the second heat conductor, stacking the circuit board and the heat dissipating member that are overlapped, the circuit board and the insulating film, and an air layer is formed between the circuit board and the heat dissipating member, in at least a region in which the insulating film is not arranged, and fixing the circuit board and the heat dissipating portion together.

According to the above configuration, the heat from a heat generator can be dissipated through the heat dissipating member via the circuit board, the first heat conductor, the insulating film and the second heat conductor. Also, it is possible to maintain insulation between the circuit board and the heat dissipating member by a region arranged with a layer of air and a region arranged with the insulating film between the circuit board and the heat dissipating member. Furthermore, reworking can be made easier as it is possible to reduce the region of the heat conductor by forming an air layer between the circuit board and a heat dissipating member. Here, in regards to the deterioration of adhesive strength by the formation of an air layer between the circuit board and the heat dissipating member, it is possible to securely fix the circuit board and the heat dissipating member. As a result, it is possible to easily perform reworking while maintaining the insulation properties and conductive properties between the circuit board and the heat dissipating member. Manufacturing costs can also be reduced as the amount of a thermally conductive material used with the first heat conductor and the second heat conductor can be reduced due to the formation of an air layer between the circuit board and the heat dissipating member.

The following describes a preferred embodiment of the technology of the present description.

The heat generator may include a low heat generator and a high heat generator that generates more heat than the low heat generator, the insulating film may be arranged in a region overlapped by the high heat generator, and the air layer may be formed in a region overlapped by the low heat generator. Thus, it is possible to maintain insulation between the circuit board and the heat dissipating member with a simple configuration.

A recess may be formed in a region on a circuit board side of the heat dissipating member where the insulating film is not arranged. Thus, the insulation can be increased as it is possible to enlarge the thickness dimension of the air layer between the circuit board and the heat dissipating member through the recess of the heat dissipating member.

At least one of the first heat conductor or the second heat conductor may be made of thermal grease. Thus, removal of such parts as a circuit board or a heat dissipating member can be easily performed compared to a case in which an adhesive is used as a first heat conductor and a second heat conductor.

The insulating film may have a contact which is in contact with the first heat conductor and the second conductor, and may have an extension that is extended to the outer side of the first heat conductor and the second conductor. Thus, it is possible to increase the insulation between the circuit board and the heat dissipating member through the extending portion of the insulating film.

According to the technology of the present description, reworking can be easily performed while maintaining the electrical insulation and heat dissipation properties between a circuit board and a heat dissipating member.

DETAILED DESCRIPTION OF EMBODIMENTS

Embodiment

Figure 1:
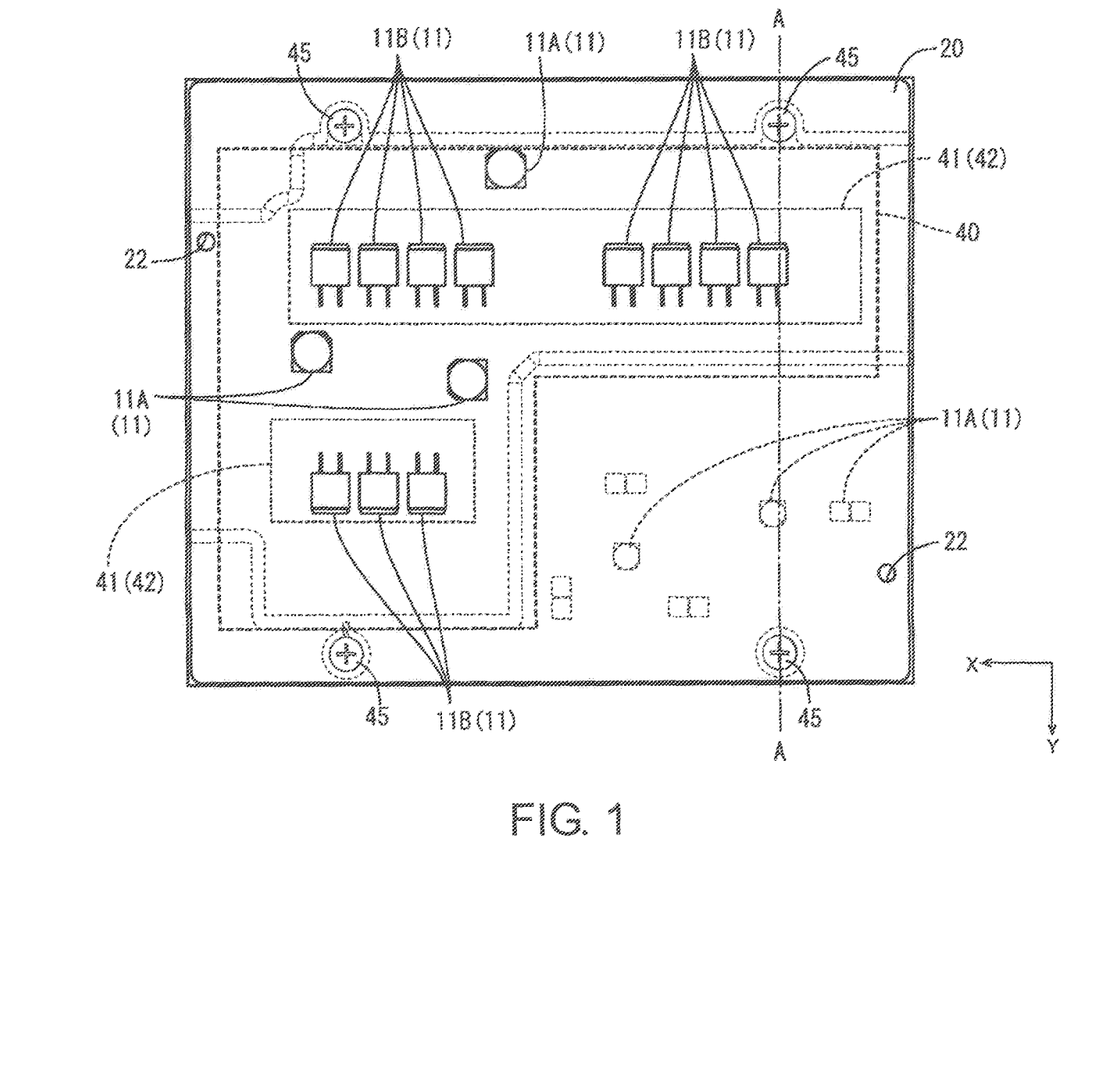
FIG. 1 is a plan view showing the circuit assembly of one embodiment

A circuit assembly 10 of the present embodiment may be, for example, provided in a wheeled vehicle such as an electric automobile or a hybrid automobile, and may be arranged, for example, in the electrical power distribution path that leads from an electrical power source to a load such as a motor of a hybrid vehicle. This circuit assembly 10 can be provided in any direction in the vehicle, but in the following description, the X direction of FIG. 1 and FIG. 2 is the forward direction, the Y direction is the leftward direction, and the Z direction is the upward direction.

Figure 2:
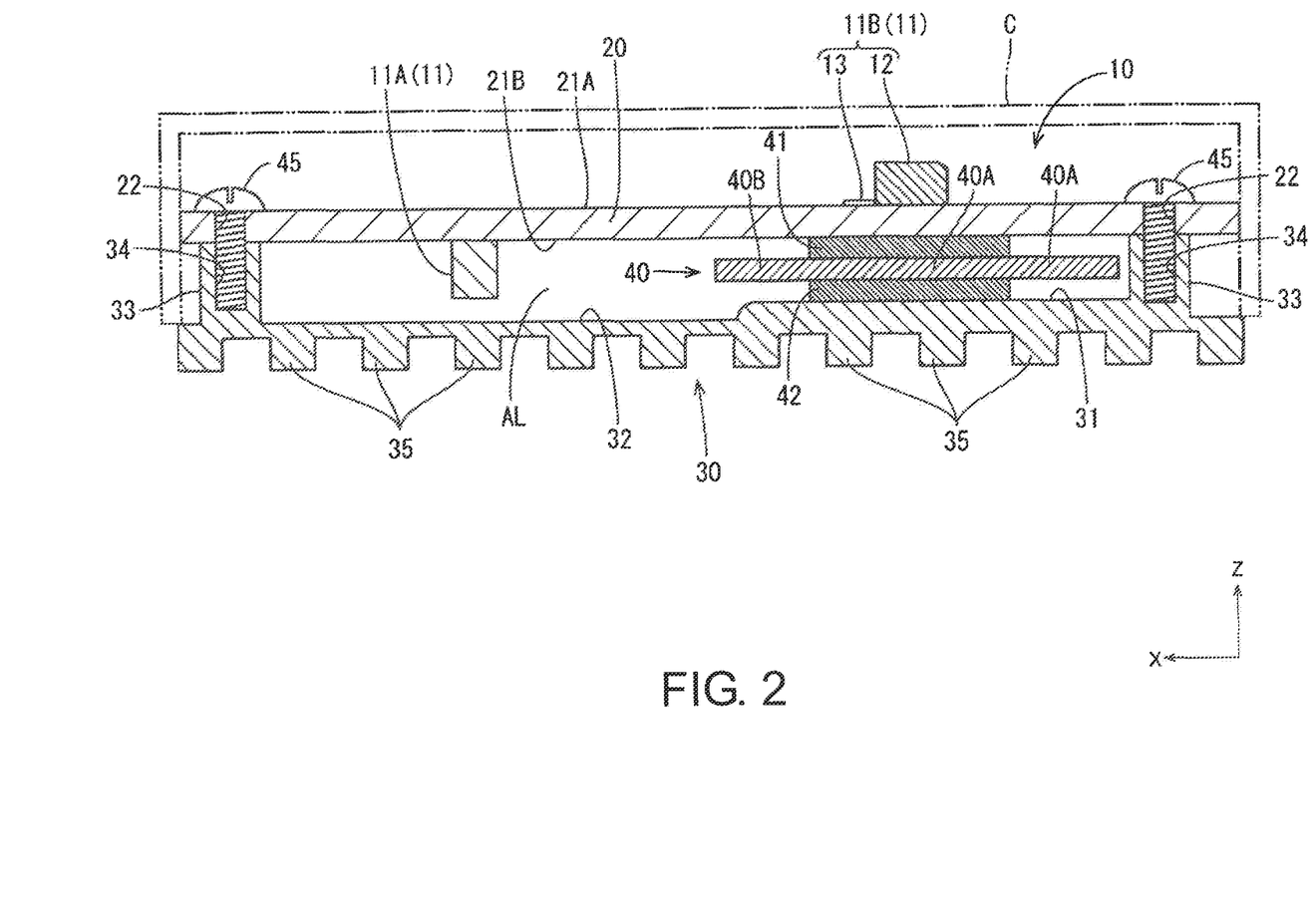
FIG. 2 is a cross-sectional figure along A-A of FIG. 1.

The circuit assembly 10 has, as shown in FIG. 2, heat generating components 11 ("heat generator"), a circuit board 20 to which the heat generating components 11 are mounted, a heat dissipating member 30 that is arranged facing the circuit board 20 across a gap, an insulating film 40 that is arranged between the circuit board 20 and the heat dissipating member 30, heat conduction portions 41 and 42 ("heat conductors") which are each overlapped by the insulating film 40, and screws 45 (an example of a "fixing means") that fix the circuit board 20 and the heat dissipating member 30 together.

Figure 3:
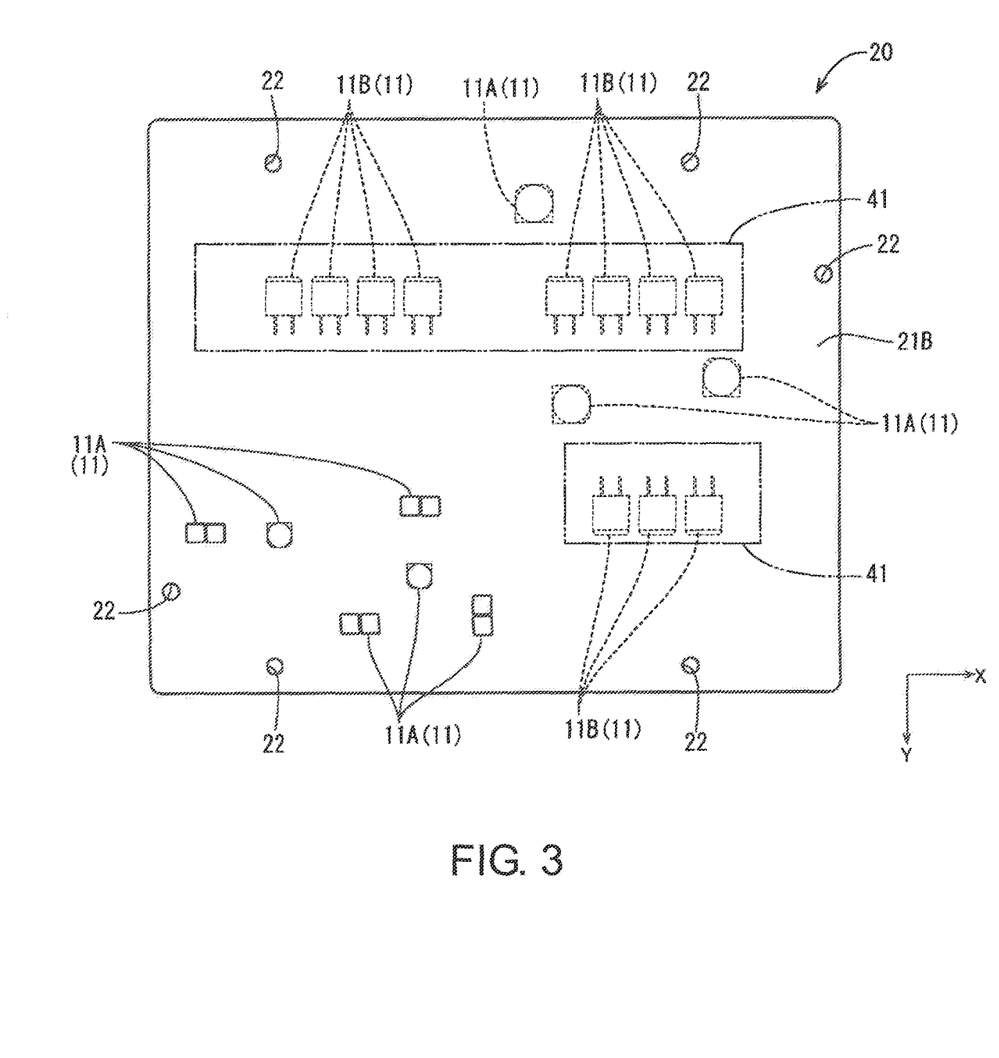
FIG. 3 is a rear view of a circuit board.

The heat generating components 11 include electronic components that generate heat when current flows through them, and, as shown in FIG. 3, include low heat generating components 11A and high heat generating components 11B that generate more heat than the low heat generating components 11A. The low heat generating components 11A can be capacitors, for example. The high heat generating components 11B are surface-mounting type FET (field effect transistor) in the present embodiment. The high heat generating components 11B have a main body 12 with a boxed-shaped package and a plurality of lead terminals 13. The plurality of lead terminals 13 are, for example, provided on a bottom surface and a side surface of the main body 12.

The circuit board 20 has an approximately rectangular board shape, and has conduction paths 21A and 21B, which are made from a conductive material, such as a copper film, on both the upper and lower sides of an insulating board made of an insulating material, and which are formed with printed circuit technology. The conduction paths 21A and 21B are electrically connected via a through hole (not shown) that runs through the insulating board. A plurality of insertion holes 22 through which the shafts of the screws 45 can be inserted are formed at the circumferential edge of the insulating substrate.

Figure 4:
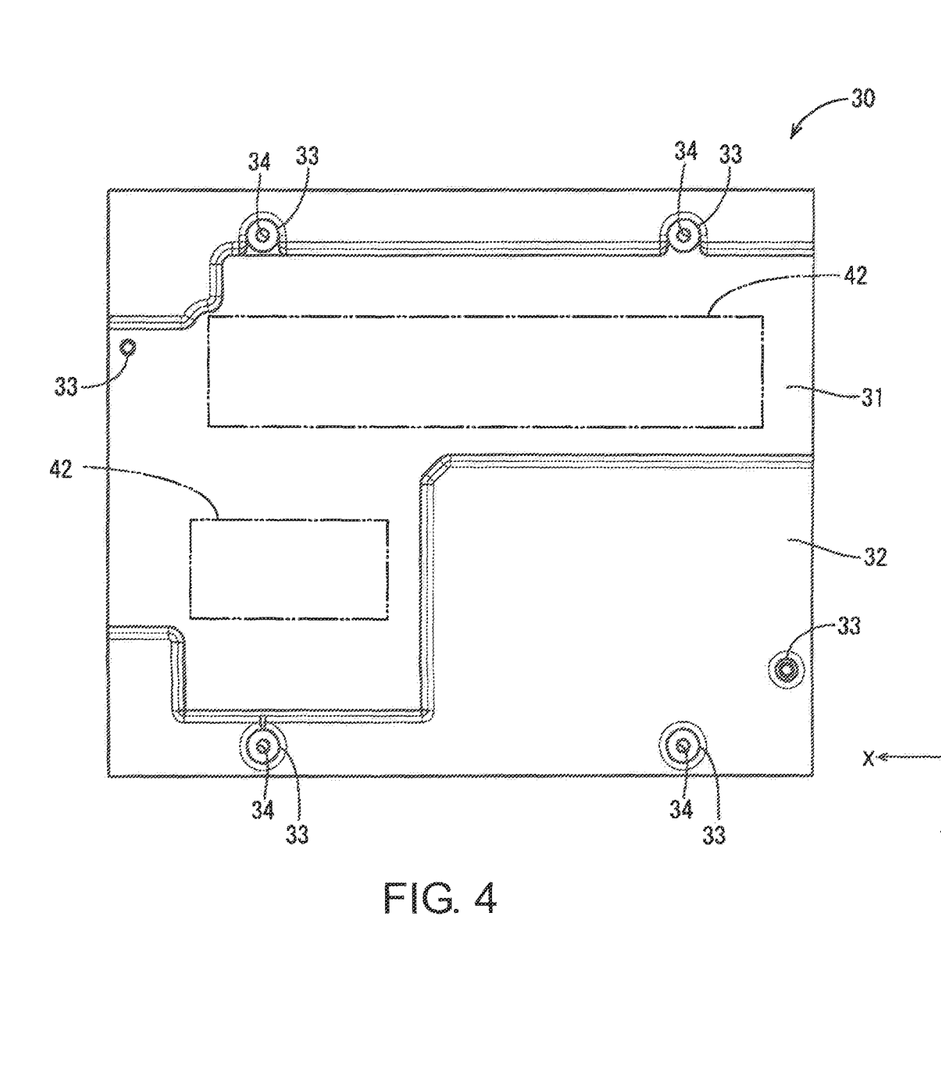
FIG. 4 is a plan view showing a heat dissipating member.

The heat dissipating member 30 is made from highly thermally conductive metals such as an aluminum or aluminum alloy with high thermal conductivity, and as shown in FIG. 2, includes a plurality of heat dissipating fins 35 lined up in a comb shape its a bottom side. As shown in FIGS. 2 and 4, the upper side of the heat dissipating member 30 has a level portion 31 with a large thickness and a recessed portion 32 whose surface is depressed below the level portion 31. The level portion 31 is disposed in an L-shaped region that is overlapped by the high heat generating components 11B mounted on the circuit board 20, and the recessed portion 32 is disposed in a region that is overlapped by the low heat generating components 11A mounted on the circuit board 20. Boss portions 33 which form a base on which circuit board 20 sits protrude upward from the upper surface of the heat dissipating member 30. The boss portions 33 are arranged near the circumferential edge in the upper surface of the heat dissipating member 30, and a predetermined gap between the lower surface of the circuit board 20 and the upper surface 4 of the thermal dissipating member 30 is maintained due to the outer circumferential portion of the circuit board 20 being placed on the boss portions such that the boss portions 33 support the circuit board 20. A screw hole 34 into which a screw can be screwed from above is formed in the boss portions 33.

The insulating film 40 is thin, flexible, and can be a polyamide insulating resin film, for example. The insulating film 40 is arranged in a region (a projection region) overlapping with the high heat generating components 11B, which are mounted to the circuit board 20, has a contact portion 40A that is in contact with both of the conduction units 41 and 42, and has an extending portion 40B that extends beyond the conduction units 41 and 42 but does not come into contact with the conduction units 41 and 42. In the present embodiment, the insulating film 40 covers an L-shaped region. Here, as shown in FIG. 2, an air layer AL forms in a region between the circuit board 20 and the heat dissipating member 30 in which the insulating film 40 is not arranged. The air layer AL spreads over the entire space between the circuit board 20 and the heat dissipating member 30 (region from the edge of the insulating film 40 to the boss portion 33) in which the insulating film 40 is not arranged. The low heat generating components 11A, which have a large height and are mounted to a rear side of the circuit board 20, are arranged in a space of the air layer AL above the recessed portion 32 of the heat dissipating member 30.

The heat conduction portions 41 and 42 are made of a thermally conductive material that has high thermal conductivity, and can be made using an adhesive or glue that have insulation, such as, for example, a heat dissipating grease such as silicone grease, adhesive heat dissipating grease whose adhesiveness is strengthened by adding additives to heat dissipating grease, or an epoxy adhesive. The thermally conductive material may be one that hardens at room temperature or one that hardens with the application of heat. As shown in FIGS. 3 and 4, the heat conduction portions 41 and 42 are arranged to overlap the high heat generating components 11B. The first heat conduction portion 41 is bonded to the lower side of the circuit board 20 and the upper side of the insulating film 40, and the second heat conduction portions is bonded to the lower side of the insulating film 40 and the upper side of the heat dissipating member 30.

As shown in FIG. 2, the screws 45, have a head portion and a shaft portion, and fasten and fix the circuit board 20 and the heat dissipating member 30. Through this, the screws 45 can securely fix the circuit board 20 and the heat dissipating member 30 together, even if the fastening strength of the heat conduction portions 41 and 42 between the circuit board 20 and the heat dissipating member 30 degrades due to the presence of the air layer AL, in comparison to a configuration in which the heat conduction portions 41 and 42 is provided everywhere between the circuit board 20 and the heat dissipating member 30.

The following describes a manufacturing process of an electrical junction box.

Figure 5:
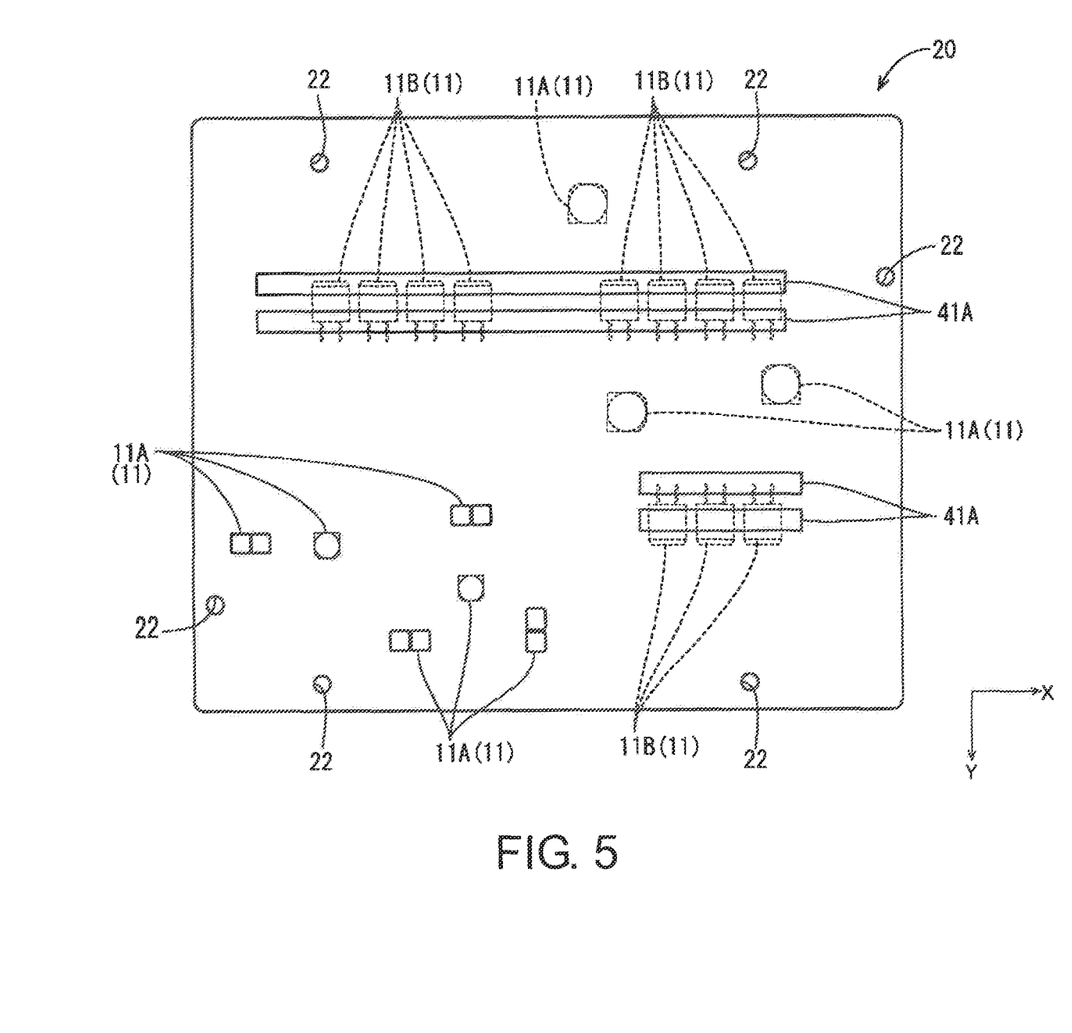
FIG. 5 is a diagram showing the state in which a thermally conductive material is applied to a rear side of a circuit board.
Figure 6:
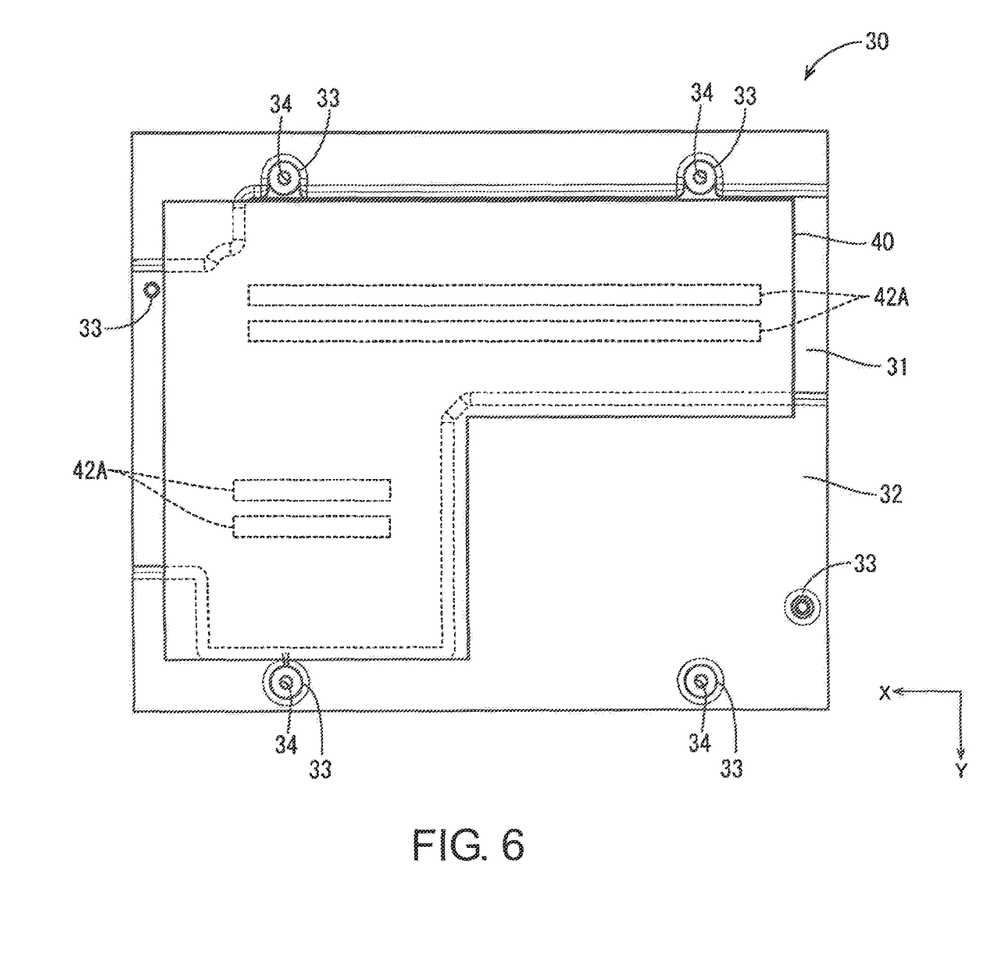
FIG. 6 is a diagram showing the state in which a thermally conductive material is applied to an upper side of a heat dissipating member, and overlapped by an insulating film.

The heat generating components 11 are mounted to the circuit board 20 by reflow soldering or the like. Next, as shown in FIG. 5, the thermally conductive material 41A, such as a thermal grease, is applied such that it passes through the regions where the heat generating components 11 are arranged on the rear side of the circuit board 20 (first application step). Also, as shown in FIG. 6, the thermally conductive material 42A, such as a thermal grease, is applied such that it passes through the regions where the heat generating components 11 are arranged on the upper surface of the heat dissipating member 30 (second application step).

Next, the insulating film 40 is attached overlappingly to the region where the thermally conductive material 42A has been applied on the upper side of the heat dissipating member 30 (attachment step). Note that the insulating film 40 may also be attached to a region in which the thermally conductive material 41A may also be attached to the rear side of the circuit board 20.

Then, the circuit board 20 and the heat dissipating component 30 are made to face each other, and the circuit board 20, the first thermally conductive material 41, the insulating film 40, the second thermally conductive material 42 and the heat dissipating member 30 are stacked on each other (stacking step). Next, the circuit board 20 and the heat dissipating member 30 are screwed and fixed together by the screws 45 (see FIG. 2; fixing step). Through this, the thermally conductive materials 41A and 42A are squashed and become the heat generating portions 41 and 42 which are spread in a region including all the regions overlapped by the high heat generating components 11B, and thus the circuit assembly 10 is formed. A cover C is placed over the circuit assembly 10, then the cover C is fixed to the circuit assembly 10 by screws and the like to form an electrical junction box, and the electrical junction box is then installed in a wheeled vehicle.

The following describes the effects and results achieved by the above-described embodiments.

The circuit assembly 10 includes the heat generating components 11, the circuit board 20 with the conduction paths 21A and 21B to which the heat generating components 11 are mounted, the heat dissipating member 30 that is arranged facing the circuit board 20, the insulating film 40 arranged in a region overlapped by the heat generating components 11 which are between the circuit board 20 and the heat dissipating member 30, the adhesive or sticky first heat conduction portion 41 that is in areal contact with the circuit board 20 and the insulating film 40 and is arranged between the circuit board 20 and the insulating film 40, the adhesive or sticky second heat conduction portion 42 that is in areal contact with the insulating film 40 and the heat dissipating member 30 arranged between the insulating film 40 and the heat dissipating member 30, and a screws 45 that fix the circuit board 20 to the heat dissipating member 30 (fixing means), and an air layer AL is formed in a region in which the insulating film 40 is not arranged between the circuit board 20 and the heat dissipating member 30.

For example, if only a solid tape or sheet is used at the time of assembly as the insulating and heat dissipating material between the circuit board 20 and the heat dissipating member 30, then, due to manufacturing variations across components, the clearance between the circuit board 20 and the heat generating component 30 fluctuates and there is the concern that this may put stress on any soldered points of the circuit board 20. Conversely, if only a liquid adhesive or thermal grease are used at the time of assembly, then there are the advantages that the thermal resistance is reduced and the heat dispersion is improved, because the manufacturing variations can be absorbed, stress on the circuit board 20 can be reduced and there is better adherence to the circuit board 20, but there is the concern that electrical insulation cannot be secured, because voids or foreign substances may be enclosed and the clearance may be insufficient due to manufacturing variations.

By contrast, according to the present embodiment, the heat of the heat generating component 11 can be dispersed from the heat dissipating member 30 via the circuit board 20, the first heat conduction portion 41, the insulating film 40 and the second heat conduction portion 42, and it is possible to use heat conduction portions 41 and 42 that are liquid at the time of assembly as well as an insulating film 40 that is solid at the time of assembly, so that stress on the circuit board 20 can be reduced while ensuring electric insulation.

Also, it is possible to maintain the insulation between the circuit board 20 and the heat dissipating member 30 due to the region in which the air layer AL is provided and the region in which the insulating film 40 is arranged between the circuit board 20 and the heat dissipating member 30. Furthermore, by forming the air layer AL between the circuit board 20 and the heat dissipating member 30, it is possible to easily perform reworking, because the region of the heat conduction portions 41 and 42 can be made smaller. Here, as far as the lower fastening strength due to the formation of the air layer AL between the circuit board 20 to the heat dissipating member 30 is concerned, it is possible to securely fix the circuit board 20 to the heat dissipating member 30 with the screws 45. Through this, reworking can easily be performed while maintaining the electrical insulation and the heat dispersion between the circuit board 20 and the heat dispersing member 30. Also, it is possible to reduce manufacturing costs because it becomes easy to reduce the amount of thermally conductive material which is used, due to the formation of the air layer AL in between the circuit board 20 and the heat dissipating member 30.

Also, the heat generating components 11 include low heat generating components 11A, and high heat generating components 11B that generate more heat than the low heat generating components 11A. Moreover, the insulating film 40 is arranged in a region overlapped by the high heat generating components 11B, and the air layer AL is arranged in a region overlapped by the low heat generating components 11A.

Thus, the insulation between the circuit board 20 and the heat dissipating member 30 can be maintained with a simple configuration.

Also, the recessed portion 32 is formed in a region of the heat dissipating member 30 in which the insulating film 40 is not arranged on the side facing the circuit board 20.

Thus, it is possible to increase the insulation, because it is possible to increase the thickness of the air layer AL between the circuit board 20 and the heat dissipating member 30 with the recessed portion 32 of the heat dissipating member 30.

Also, at least one of the first heat conduction portion 41 and the second heat conduction portion 42 is made of a thermal grease. Thus, it becomes easier to perform the task of removing the circuit board 20, the heat dissipating member 30 or the like, compared to a case in which an adhesive is used as the first heat conduction portion 41 or the second heat conduction portion 42.

Also, the insulating film 40 has a contact portion 40A that is in contact with the first heat conduction portion 41 and the second heat conduction portion 42, and an extending portion 40B that extends to the outer side of the first heat conduction portion 41 and the second heat conduction portion 42. Thus, the insulation between the circuit board 20 and the heat dissipating member 30 can be increased by the extending portion 40B of the insulating film 40.

Other Embodiments

The technology disclosed in this description is not limited to the embodiment described with the above description and figures, and also the following embodiments are included in the technical scope disclosed in this specification.

(1) The insulating film 40 may also include an additive; for example, its thermal conductivity may be increased by using a polyimide insulating resin film with a heat conductive filler.

(2) The high heat generating components 11B were given as FETs, but there is no limitation to this. For example, they may also be a mechanical relays, resistors, or coils or the like. Also, the low heat generating components 11A are not limited to capacitors, and may also be other electrical components.

(3) The circuit board 20 is configured with the conduction paths 21A and 21B formed on both sides of an insulating circuit board, but it may also be configured with a conduction path on only one surface, or using a multilayer board with a plurality of conduction paths. Also, the circuit board may be configured with bus bars stacked on an insulating substrate on which a conduction path is formed. These bus bars can be formed by punching a metal sheet made of copper or copper alloy into the shape of a conduction path with a pressing machine, and can be arranged in different regions of the same plane spaced apart by gaps.

(4) The screws 45 are used as a fixing means to fasten the circuit board 20 and the heat dissipating member 30 together, but is no limitation to this. For example, the circuit board 20 and the heat dissipating member 30 may be locked together with locking hooks as the fixing means or held by the elastic force of a clips or the like.

(5) The heat conduction portions 41 and 42 are not limited to thermally conductive material that is electrically insulating.

(6) The heat generating components 11 are mounted to the circuit board 20 prior to assembling the circuit board 20 and the heat dissipating member 30, but there is no limitation to this, and the heat generating component 11 may also be mounted to the circuit board 20 after the circuit board 20 and the heat dissipating member 30 are assembled.

What is claimed is:
1. A circuit assembly comprising:
a heat generator;
a circuit board, which has a conduction path, and to which the heat generator is mounted;
a heat dissipating member arranged facing the circuit board;
an insulating film arranged in a region that is overlapped by the heat generator between the circuit board and the heat dissipating member;
an adhesive or sticky first heat conductor that is arranged between the circuit board and the insulating film and is in contact with the circuit board and the insulating film; and
an adhesive or sticky second heat conductor that is arranged between the insulating film and the heat dissipating member and is in contact with the insulating film and the heat dissipating member, wherein:
the circuit board and the heat dissipating member are fixed together, and
an air layer is formed between the circuit board and the heat dissipating member in a region in which the insulating film is not arranged.

2. The circuit assembly according to claim 1 wherein:
the heat generator comprises a low heat generator and a high heat generator that generates higher heat than the low heat generator,
the insulating film is arranged in a region overlapped by the high heat generator, and
the air layer is formed in a region overlapped by the low heat generator.

3. The circuit assembly according to claim 1, wherein a recess is formed on a region of a surface of a circuit board side of the heat dissipating member in which the insulating film is not arranged.

4. The circuit assembly according to claim 1, wherein at least one of the first heat conductor and the second heat conductor is made of a thermal grease.

5. The circuit assembly according to claim 1, wherein the insulating film includes a contact that is in contact with the first heat conductor and the second heat conductor, and an extension that extends to an outer side of the first heat conductor and the second heat conductor.

6. A manufacturing method of a circuit assembly comprising:
applying an adhesive or sticky first heat conductor to a region which is overlapped by a heat generator, in a circuit board that has a conduction path;
applying an adhesive or sticky second heat conductor to a heat dissipating member that is arranged facing the circuit board;
bonding an insulating film to the first heat conductor or the second heat conductor;
stacking the circuit board, the insulating film, and the heat dissipating member that overlaps the circuit board, wherein an air layer is formed between the circuit board and the heat dissipating member in at least a region in which the insulating film is not arranged; and
fixing the circuit board and the heat dissipating member together.

* * * * *